United States Patent
Kuzo et al.

(10) Patent No.: US 12,261,001 B2
(45) Date of Patent: Mar. 25, 2025

(54) DETECTING PUSH BUTTON PRESS OF A PASSIVE ROTARY KNOB ON A TOUCH SCREEN

(71) Applicant: Cypress Semiconductor Corporation, San Jose, CA (US)

(72) Inventors: Taras Kuzo, Lviv (UA); Shoushuai Zhao, Pudong (CN); Viktor Kremin, Lviv (UA)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 17/954,182

(22) Filed: Sep. 27, 2022

(65) Prior Publication Data

US 2024/0105404 A1 Mar. 28, 2024

(51) Int. Cl.
| | | |
|---|---|---|
| G06F 3/0362 | (2013.01) | |
| G06F 3/039 | (2013.01) | |
| G06F 3/044 | (2006.01) | |
| H01H 13/14 | (2006.01) | |
| H01H 13/20 | (2006.01) | |
| H01H 19/14 | (2006.01) | |

(52) U.S. Cl.
CPC ........... *H01H 13/20* (2013.01); *G06F 3/0362* (2013.01); *G06F 3/0393* (2019.05); *G06F 3/0446* (2019.05); *H01H 13/14* (2013.01); *H01H 19/14* (2013.01); *H01H 2235/01* (2013.01)

(58) Field of Classification Search
CPC ........ H01H 13/20; H01H 13/14; H01H 19/14; H01H 2235/01; G06F 3/0362; G06F 3/0393; G06F 3/0446; H03K 17/962
See application file for complete search history.

(56) References Cited

U.S. PATENT DOCUMENTS

| | | | | |
|---|---|---|---|---|
| 2013/0229339 A1* | 9/2013 | Takahata | ............... | G06F 3/0362 |
| | | | | 345/156 |
| 2015/0242000 A1* | 8/2015 | Dowd | ................... | G06F 3/0393 |
| | | | | 345/179 |
| 2020/0019263 A1* | 1/2020 | Korherr | ............... | G06F 3/0362 |
| 2020/0073487 A1* | 3/2020 | Ballan | ................... | G06F 3/0362 |

FOREIGN PATENT DOCUMENTS

| | | | |
|---|---|---|---|
| CN | 110626294 A | * | 12/2019 |
| CN | 212303512 U | * | 1/2021 |
| DE | 102020116531 A1 | * | 12/2021 |

* cited by examiner

*Primary Examiner* — Temesghen Ghebretinsae
*Assistant Examiner* — K. Kiyabu (57) ABSTRACT

A touch screen device is disclosed. The touch screen device includes a touch screen panel having a capacitive sense array, and a passive dial including first, second and third conductive parts. The first conductive part and the third conductive part are in proximity to a surface of the touch screen panel, and the second conductive part is conductively coupled to the third conductive part when the passive dial is pressed and is not conductively coupled to the third conductive part when the passive dial is not pressed. A position of the first conductive part above the capacitive sense array corresponds to a touch index in the capacitive sense array and a position the third conductive part above the capacitive sense array corresponds to a button press index in the capacitive sense array. The first, second and third conductive parts are movable in conjunction with a rotation of the passive dial.

15 Claims, 7 Drawing Sheets

DETECTING PUSH BUTTON PRESS OF A PASSIVE ROTARY KNOB ON A TOUCH SCREEN

FIELD OF THE INVENTION

Embodiments of the present disclosure relate generally to rotary dial push button technologies. More specifically, embodiments of the disclosure relate to detection of a push button press of a passive rotary knob on a capacitive touch screen.

BACKGROUND

Capacitive sense arrays and touch buttons are ubiquitous in today's industrial and consumer markets. Capacitive sense elements may be used to replace the functionality of mechanical buttons, dials/knobs, and other similar mechanical user interface controls. Despite this, dials remain a popular option among users in many applications, for example in cars due to their native haptic and human habit preferences. However, the expanding size of touch screens in vehicles and other applications often reduces the space available for dials. In addition, because touch screens can replace the functionality of dials, a separate dial may be redundant.

Existing rotary dial push button solutions are generally implemented using an electrical button that conducts voltage in a connected or pressed state to generate a "Push Button" signal, and does not conduct voltage in a disconnected or not pressed state. Implementations of those types of rotary dial push button require three wires, namely, Vcc, ground (GND), and Press Signal. Therefore, such implementations would require additional physical space and costs.

In addition, some of the disadvantages of the current solutions include expensive cost, complicated touch screen design, mechanical and reliability issues, and additional physical space, considering that the solutions require an electric push button with wires and holes in the touch screen to route those wires, among other things.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment. Random access refers to access (read/write) to a random offset of a file at least once during a read/write input/output operation.

According to a first aspect, a touch screen device is provided. The touch screen device includes a touch screen panel having a capacitive sense array, and a passive dial including first, second and third conductive parts. The first conductive part and the third conductive part are in proximity to or in contact with a surface of the touch screen panel, and the second conductive part is conductively coupled to the third conductive part when the passive dial is pressed and is not conductively coupled to the third conductive part when the passive dial is not pressed. A position of the first conductive part above the capacitive sense array corresponds to a touch index in the capacitive sense array and a position the third conductive part above the capacitive sense array corresponds to a button press index in the capacitive sense array. The first, second and third conductive parts are movable in conjunction with a rotation of the passive dial.

According to a second aspect, a method of detecting a press state of a passive dial is provided. The method includes calculating a number of sensors in a capacitive sense array that have crossed a touch knob threshold. The method further includes determining whether the calculated number of sensors is greater than or equal to a press sensor number threshold. The method further includes in response to determining that the calculated number of sensors is greater than or equal to the press sensor number threshold, determining whether a difference between a sum of one or more knob signals in a current frame and a sum of one or more knob signals in one or more previous frames is greater than or equal to a press sensor sum jump threshold. The method further includes in response to determining that the difference is greater than or equal to the press sensor sum jump threshold, calculating an angle difference between a first index in the capacitive sense array and a second index in the capacitive sense array, and calculating a peak value of the second index.

According to a third aspect, a passive dial is provided. The passive dial includes first, second and third conductive parts. The first conductive part and the third conductive part are in proximity to or in contact with a surface of a touch screen panel having a capacitive sense array, and the second conductive part is conductively coupled to the third conductive part when the passive dial is pressed and is not conductively coupled to the third conductive part when the passive dial is not pressed. A position of the first conductive part above the capacitive sense array corresponds to a touch index in the capacitive sense array and a position the third conductive part above the capacitive sense array corresponds to a button press index in the capacitive sense array.

The first, second and third conductive parts are movable in conjunction with a rotation of the passive dial.

Figure 1:
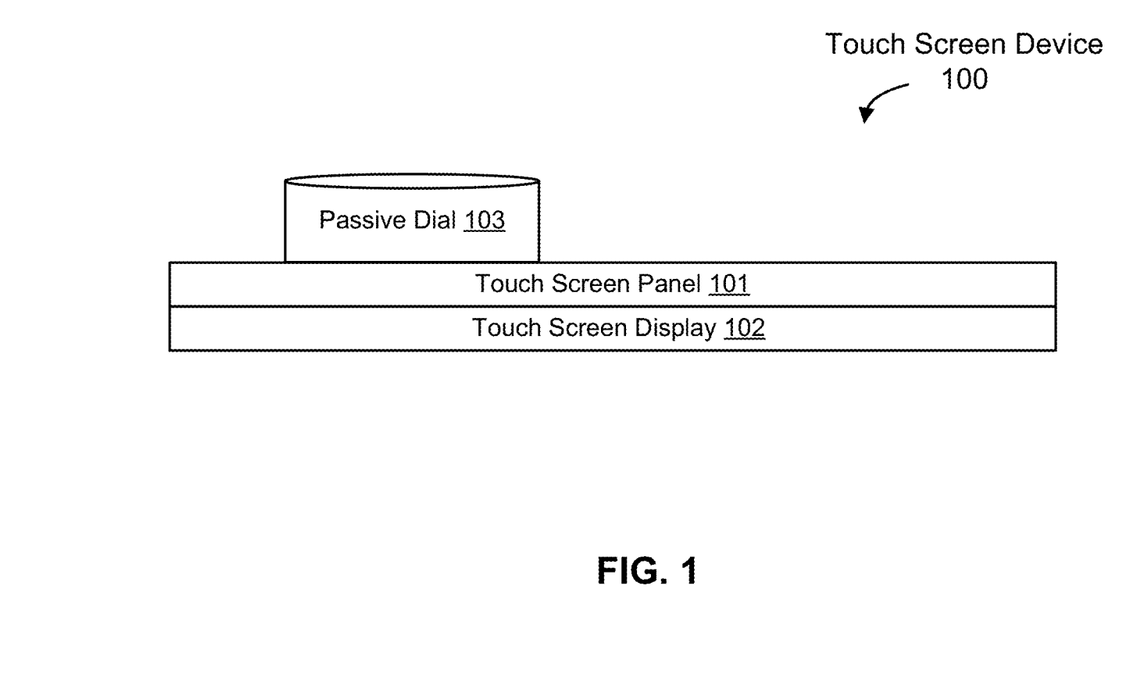
FIG. 1 is a block diagram illustrating a sectional view of a touch screen device having a passive dial mounted on a touch screen panel according to an embodiment.

FIG. 1 is a block diagram illustrating an example touch screen device according to an embodiment. Referring to FIG. 1, touch screen device 100 may include a touch screen panel 101 (e.g., capacitive, inductive, resistive touch screen panel, etc.) and a touch screen display 102, with a passive dial 103 mounted on the touch screen panel 101. As shown, the touch screen panel 101 may be layered on the top of the touch screen display 102.

In an embodiment, the touch screen panel 101 may include a capacitive sense array (not shown), and a touch panel or touch screen controller (also not shown) configured to measure capacitances (e.g., self or mutual capacitances) from the capacitive sense array. In an embodiment, the capacitive sense array may include capacitive sensors (e.g., mutual or self-capacitance sensors, or other appropriate sensors) that are disposed as a two-dimensional matrix (also referred to as X-Y matrix). The capacitive sense array may be coupled to the touch screen controller via one or more buses transporting a number of signals. In an embodiment, the touch screen panel 101 may further include an insulator (e.g., glass) coated with a transparent conductor (e.g., indium tin oxide or ITO). The touch screen controller is typically a complementary metal-oxide-semiconductor (CMOS) application-specific integrated circuit (ASIC) chip that sends the signals to a CMOS digital signal processor (DSP) for processing.

In an embodiment, the touch screen display 102 can be any type of display device, such as a liquid crystal display (LCD), a light-emitting diode (LED) display, an active-matrix organic light-emitting diode (AMOLED) display, or an organic light-emitting diode (OLED) display.

In an embodiment, the touch screen device 100 may be used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons or trackpad). In one embodiment, these sensing devices include one or more capacitive sensors or other types of capacitance-sensing circuitry. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

With continued reference to FIG. 1, the passive dial 103 may be a rotary mechanism (e.g., a knob) and may be mounted on an active area (e.g., where the capacitive sensors are located) of the touch screen panel 101. In some embodiments, the passive dial 103 can be mounted entirely on the active area of the touch screen panel 101, or mounted partially on the active area of the touch screen panel 101, with part of the passive dial 103 overlapping an area that is not within the active area of the touch screen panel 101. The passive dial 103 may be mounted at any appropriate location on the touch screen panel 101. In some embodiments, the passive dial 103 may include an acrylic panel that is glued to the surface of touch screen panel 101. The dial 103 may be a passive device, and thus may not include electronics of any kind (e.g., on-board measurement system) or be powered in any way. Thus, the dial 103 does not require an electrical button, additional wires, and holes in the touch screen panel 101. The dial 103 can be used with different interface designs through firmware tuning.

Figure 2:
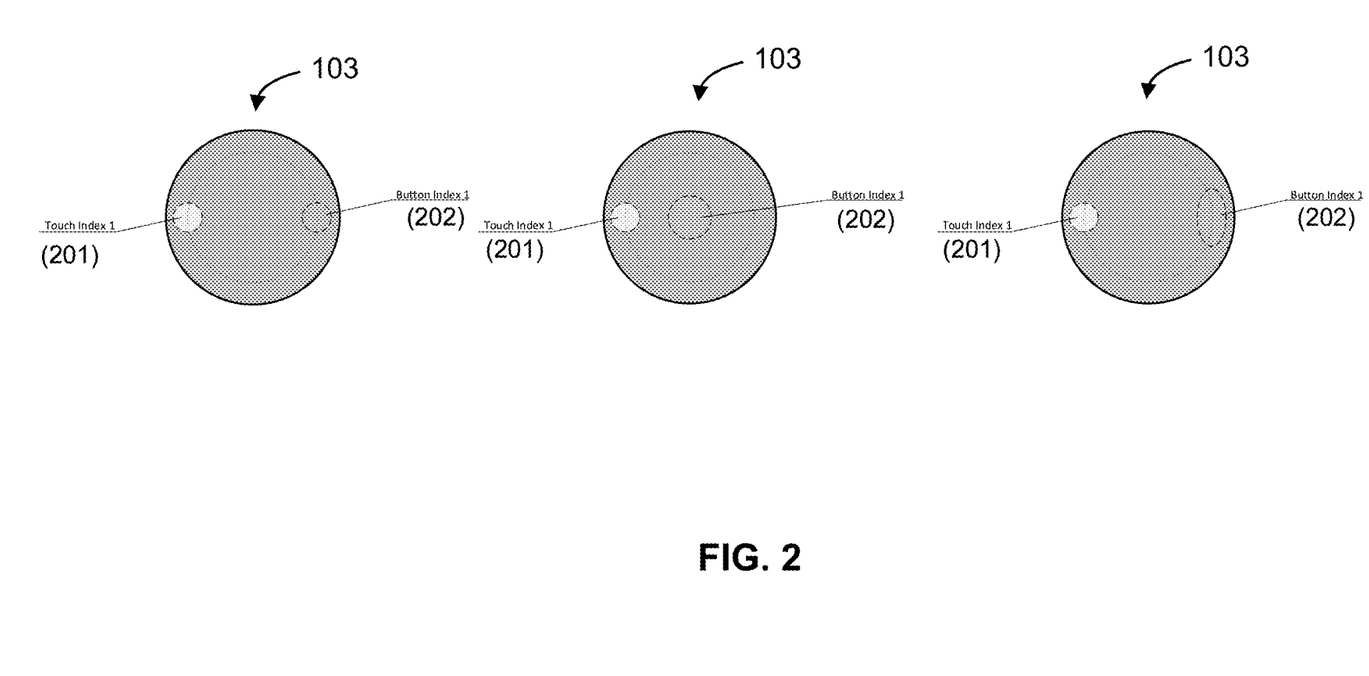
FIG. 2 is a diagram illustrating example passive dials according to an embodiment.

FIG. 2 is a diagram illustrating example passive dials according to an embodiment. In FIG. 2, passive dial 103 may include a first conductive element 201 and a second conductive element 202. Conductive element 201 may be mounted on the passive dial 103 such that the conductive element 201 is in close proximity to or in contact with the touch screen panel 101. In this way, the conductive element may have electrical, electric field or capacitance coupling with the touch screen panel 101 such that an angle of the dial 103 can be determined. In an embodiment, second conductive element 202 may also be mounted on the passive dial 103 such that the conductive element 202 may be in contact with (or in close proximity to) the touch screen panel 101, but not connected to other conductive or metal parts of the passive dial 103 (e.g., cup, index 1, conductive or metal disc, etc.), when the dial 103 is in a NOT PRESS position. In another embodiment, the conductive element 202 may be in contact with (or in close proximity to) the touch screen panel 101 and connected to the other conductive or metal parts of the passive dial 103 when the dial 103 is in a PRESS position (simulating a human finger or hand coming into contact or close proximity with the touch screen panel 101).

In operation, as the dial 103 is rotated, the conductive element 201 may rotate, and thus the rotation and current angle of the conductive element 201 (and thus the dial 103) may be determined or calculated based on one or more touch or position indices of the capacitive sense array. For example, the touch screen controller may obtain from the capacitive sense array, a capacitance touch signal data set resulting from rotation of the conductive element 201 through every angle (e.g., 0-360°), and position detection firmware executing on the touch screen controller identifies data set areas (which may represent touch or position indices) that indicate an angle of the conductive element 201 based on the peaks in the data set. For example, the firmware can calculate an angle of rotation of the conductive element 201 using a correlation algorithm. As used herein, the angle of the dial or conductive element may refer to the current angle of the dial or conductive element. Moreover, aspects of detecting the angle of the dial have been previously disclosed in U.S. Pat. No. 11,119,602, entitled "DETECTING THE ANGLE OF A TOUCH SCREEN MOUNTED PASSIVE DIAL," issued on Sep. 14, 2021, the disclosure of which is incorporated herein by reference.

In an embodiment, the conductive element 202 may also rotate with the dial 103 as the dial 103 is rotated. When the dial 103 is pressed, the conductive element 202 may touch or be in close proximity to a surface of the touch screen panel 101 and be connected to other conductive or metal parts of the dial 103 (e.g., cup, index 1, conductive or metal disc, etc.) or ground, causing a capacitance change at a specific location on the surface of the touch screen panel 101. The touch screen controller can measure the change in capacitance and determine a location of the touch or contact that may correspond to a button index (or button press index). When the dial 103 is not pressed, the conductive element 202 is in contact with (or in close proximity to) the touch screen panel 101, but is disconnected from the other conductive or metal parts of the dial 103, such that no change in capacitance or an insufficient change in capacitance exists on the surface of the touch screen panel 101 indicating the absence of a press.

Each of conductive elements 201-202 may be made of any appropriate metal (or conductive material) and may have any appropriate shape. Conductive elements 201-202 may also be disposed at any location on the dial 103. As shown in FIG. 2, in an embodiment, the conductive elements 201-202 may be approximately of the same size and of cylinder shaped having a circular cross section. In this embodiment, they are mounted opposite from one another around the peripheral of the dial 103. In another embodiment, as described in more detail herein below with reference to FIG. 6, the conductive elements 201-202 may be of different sizes and of cylinder shaped having a circular cross section. In this embodiment, the conductive element 201 may be mounted around the peripheral of the dial 103 and the conductive element 202 may be mounted at the center of the dial 103. In yet another embodiment, the conductive elements 201-202 may be of different sizes, with the conductive element 201 being of a cylinder shaped having a circular cross section and the conductive element 202 being of a cylinder shaped having an oval cross section. In this embodiment, the conductive elements 201-202 are mounted opposite from one another around the peripheral of the dial 103. It should be noted that the embodiments illustrated in FIG. 2 are merely examples and are not limited. In some embodiments, dial 103 may include one or many conductive elements 202. Conductive element 202 may be of any free shape capable of receiving signals when dial 103 is pressed.

Figure 3A:
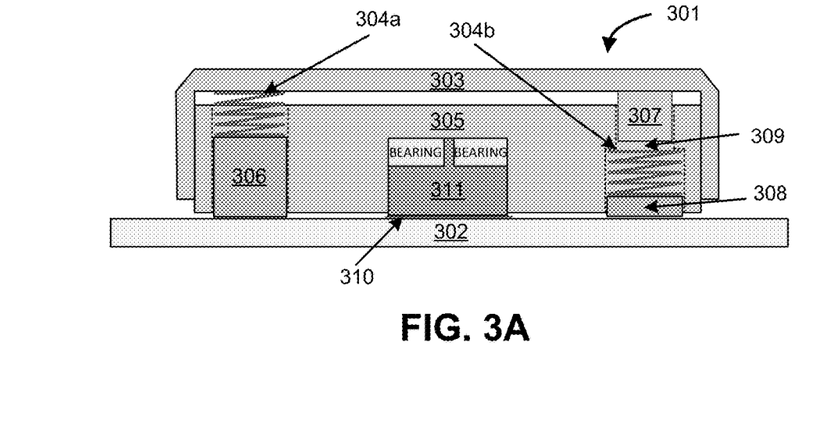
FIGS. 3A-3B are block diagrams illustrating sectional views of a passive dial according to an embodiment.
Figure 3B:
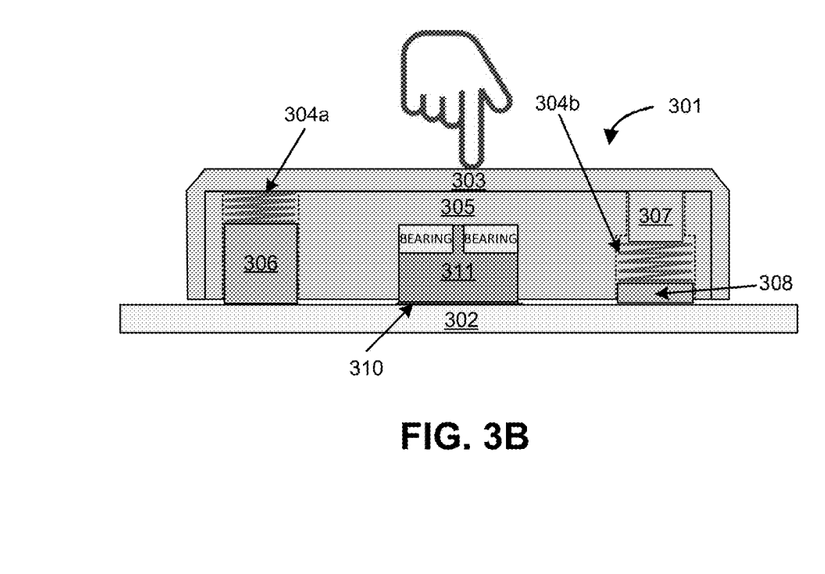

FIGS. 3A-3B are block diagrams illustrating sectional views of a passive dial according to an embodiment. In some embodiments, passive dial 301 may be the passive dial 103 of FIGS. 1-2. Referring to FIG. 3A, which represents a "not press" state of the dial 301, passive dial 301 may include, but not limited to, conductive springs 304a-b, non-conductive part 305, a first conductive part 306, a second conductive part 307, a third conductive part 308, and a rotating element 311. The passive dial 301 may also include a cover 303 (e.g., a conductive cup) that covers entirely or partially the components 304-308 and 311. The cover 303 provides a connection between a human finger or hand and the conductive parts 306 and 308. In an embodiment, the cover 303 is made of a conductive material, such as metal or any other appropriate material.

As shown, the passive dial 301 may be mounted on a touch screen panel 302 using a polymer layer 310 (e.g., epoxy or any appropriate polymer) that bonds together the rotating element 311 and the touch screen panel 302. The rotating element 311 may be disposed approximately at the center of the passive dial 301. The rotating element 311 can be a rotating shaft with bearings mounted thereon to assist the rotation of the dial 301 and reduce friction. The conductive parts 306 and 308 may touch or be in close proximity (e.g., 0.1-0.5 millimeters) to the surface of the touch screen panel 302. On the left end of the dial 301, the conductive spring 304a may be disposed between the cover 303 and the first conductive part 306. The conductive spring 304a can be in contact with the cover 303 and conductive part 306. On the right end of the dial 301, the second conductive part can be connected or bonded to the cover 303. The conductive spring 304b may be disposed between the second conductive part 307 and the third conductive part 308, with one end of the spring 304b being in contact with the conductive part 308 and another end being spaced apart from the conductive part 307 by a spacing 309. Thus in FIG. 3A, the conductive part 307 is not conductively coupled to the conductive part 308. The non-conductive part 305 may include a number of slots for holding and securing the conductive parts 306-308 and conductive springs 304a-b in their respective positions without electromagnetic or electrical interference. In this way, the components 304-308 along with the cover 303 can be assembled or mounted on the rotating element 311 for rotation with the rotating element 311.

Accordingly, since the conductive spring 304a is in contact with the cover 303 and the conductive part 306, those components may have electrical or capacitance coupling with the touch screen panel 302 such that an angle of the dial 301 can be detected. As the dial 301 rotates, the cover 303, conductive spring 304a and conductive part 306 also rotate, and thus the rotation and current angle of the dial 301 can be determined by using one or more touch/position indices provided by the capacitive sense array in the touch screen panel 302. For example, a touch screen controller (not shown) coupled to the touch screen panel 302 may obtain, from the capacitive sense array, a capacitance touch signal data set resulting from rotation of the conductive spring 304a and conductive part 306 through every angle (e.g., 0-360°), and position detection firmware executing on the touch screen controller can identify data set areas that indicate an angle of the dial 301 based on the peaks in that data set.

Referring now to FIG. 3B, when the dial 301 is pressed, the conductive part 307 compresses the conductive spring 304b and comes into contact with the spring 304b. As one end of the spring 304b is already in contact with the conductive part 308, the conductive part 307 therefore is conductively coupled to the conductive part 308 causing a capacitance change at a specific location on the surface of the touch screen panel 302 when the dial 301 is pressed. As previously described, the touch screen controller coupled to the touch screen panel 302 can measure the change in capacitance and determine a location of the touch or contact that may correspond to a button index (or button press index).

Figure 4:
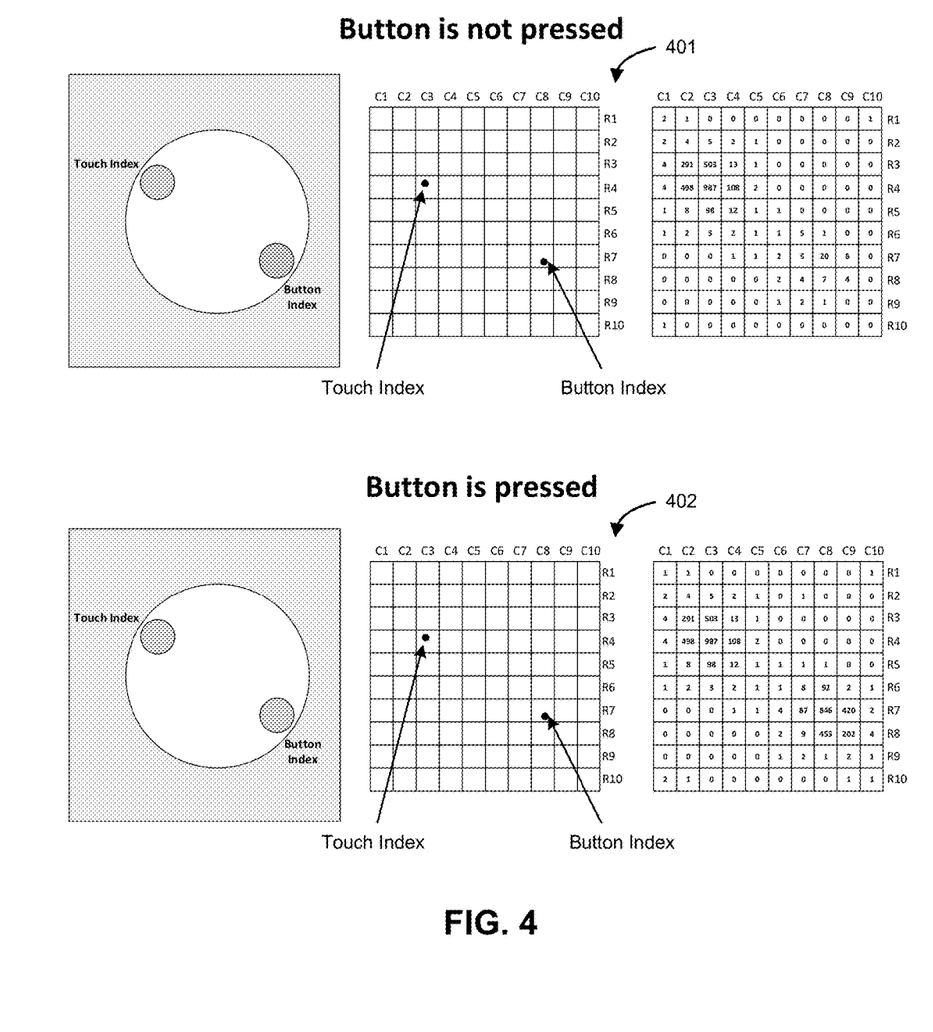
FIG. 4 is a diagram illustrating examples of capacitive sensing matrices according to an embodiment.

FIG. 4 is a diagram illustrating examples of capacitive sensing matrices according to an embodiment. In FIG. 4, capacitive sensing matrices 401-402 (e.g., heat maps) show different positions of a touch index and a button (or button press) index on the matrices. Each matrix element of the capacitive sensing matrices 401-402 may correspond to one or more capacitive sensors of the capacitive sensor array and the matrix element may include a value of the change in capacitance (as shown).

As shown, "Touch Index" may correspond to a position of a conductive element (e.g., conductive element 201 of FIG. 2 or 306 of FIG. 3) on or above a capacitive sense array. "Button Index" may correspond to a position of another conductive element (e.g., conductive element 202 of FIG. 2 or 308 of FIG. 3) on or above the capacitive sense array. As the dial (e.g., dial 103 of FIG. 1 or 301 of FIG. 3) is rotated, the positions of Touch Index and Button Index can also be moved or rotated. In the example capacitive sensing matrix 401, the matrix element values (e.g., change in capacitance values) at a knob area corresponding to the Touch Index are high (e.g., exceeding a touch knob or dial threshold) since the conductive element corresponding to Touch Index has electrical, electric field or capacitance coupling with the touch screen panel, indicating the position of the Touch Index on the capacitive sensing matrix 401. The matrix element values at the knob area corresponding to the Button Index, however, are low (e.g., below the touch knob or dial threshold) indicating that the dial is not pressed. In other words, the electrical, electric field or capacitance coupling between the conductive element corresponding to "Button Index" and the touch screen panel does not exist. On the other hand, referring to capacitive sensing matrix 402, if the dial is pressed, the matrix element values at the area corresponding to the Button Index would be high (e.g., exceeding the touch knob or dial threshold) since the conductive element corresponding to "Button Index" has electrical or capacitance coupling with the touch screen panel.

Figure 5A:
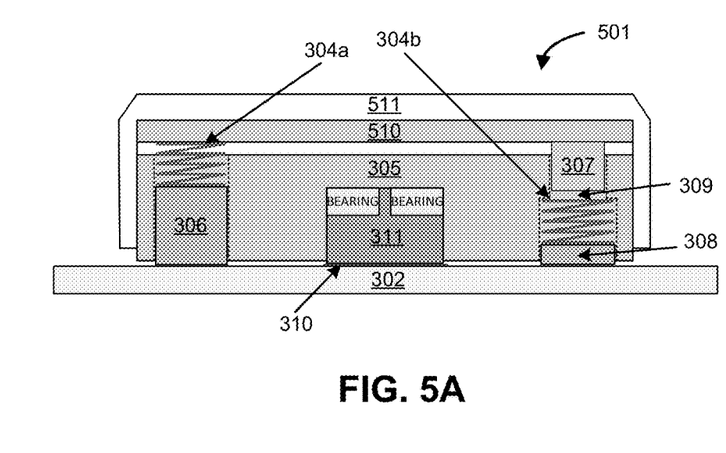
FIGS. 5A-5B are block diagrams illustrating sectional views of the passive dial according to another embodiment.
Figure 5B:
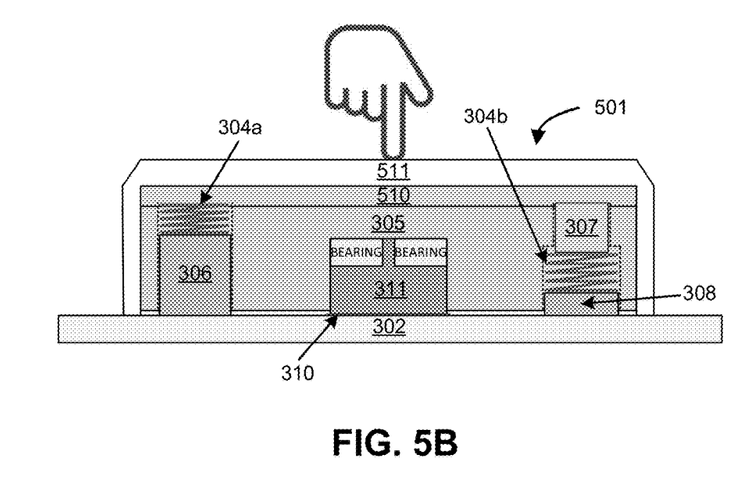

FIGS. 5A-5B are block diagrams illustrating sectional views of the passive dial according to another embodiment. In some embodiments, the components in passive dial 501 is the same as or similar to the components in passive dial 301 of FIGS. 3A-3B, and for brevity sake, those components will not be described again herein.

Referring to FIGS. 5A-5B, instead of having the conductive cover 303 (as in FIGS. 3A-3B) covering the components 304-308 and 311, the dial 501 may include a conductive layer 510 (e.g., a metal disc or another component made of a conductive material) disposed on top of those components, and in contact with the conductive spring 304a and the conductive part 307. A non-conductive cover 511 (e.g., made of plastic or an appropriate non-conductive material) may be used to cover entirely or partially the components 304-308, 311 and 510. In an embodiment, conductive layer (metal disc) 510 may perform the role of equivalent grounding due to the capacitive coupling between conductive part 306 or conductive part 308 and touch screen panel 302. By other words, the metal disc enables increase the own capacitance of the rotary knob indexes and increases the response from the index touch. Such approach can work, for example, with any gloves and human prosthesis because it does not require grounding to the human body.

FIGS. 6A-6E are diagrams illustrating example press index designs according to some embodiments. In FIGS. 6A-6E, press index designs for the dial 103 are shown in addition to those previously described in FIG. 2. For example, referring to FIG. 6A, in an embodiment, conductive elements 601a-603a may be approximately of the same size and of cylinder shaped having a circular cross section, with the conductive element 602a corresponding to a first button index ("Button Index 1") and the conductive element 603a corresponding to a second button index ("Button Index 2"). In this embodiment, the conductive elements 601a-603a may be mounted around the peripheral of the dial 103 forming a triangular pattern. In some embodiments, conductive elements 602a-603a may be of any free shape capable of receiving signals when dial 103 is pressed.

Figure 6A:
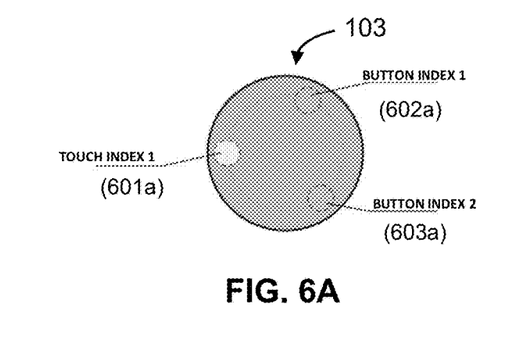
FIGS. 6A-6E are diagrams illustrating example press index designs according to some embodiments.
Figure 6B:
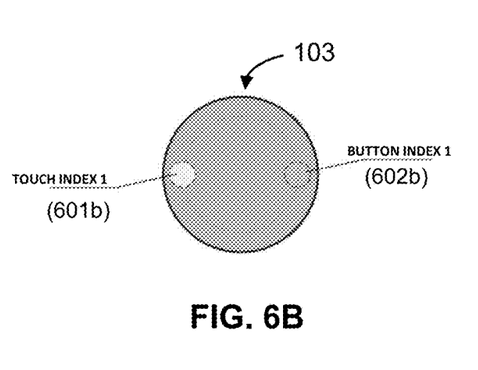

In another embodiment, referring to FIG. 6B, the conductive elements 601b-602b may be approximately of the same size and of cylinder shaped having a circular cross section. In this embodiment, they are mounted opposite from one another around the peripheral of the dial 103.

Figure 6C:
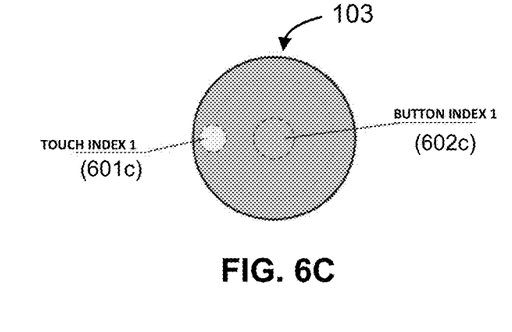

In yet another embodiment, referring to FIG. 6C, the conductive elements 601c-602c may be of different sizes and of cylinder shaped having a circular cross section. In this embodiment, the conductive element 601c may be mounted around the peripheral of the dial 103 and the conductive element 602c may be mounted at the center of the dial 103.

Figure 6D:
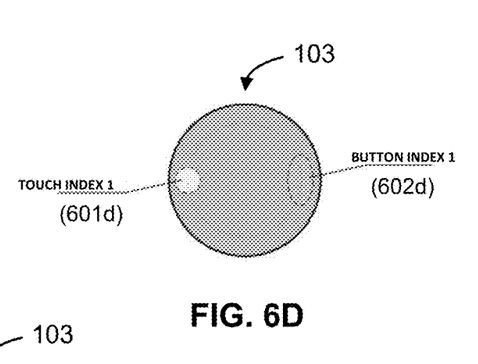
Figure 6E:
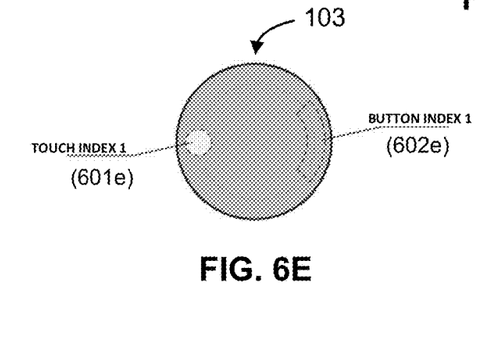

In still another embodiment, referring to FIG. 6D, the conductive elements 601d-602d may be of different shapes and sizes. In this embodiment, the conductive element 601d may be of a cylinder shaped having a circular cross section and the conductive element 602d may be of a cylinder shaped having an oval cross section. In another embodiment, referring to FIG. 6E, the conductive element 601e may be of a cylinder shaped having a circular cross section and the conductive element 602e may be of a three-dimensional geometric shaped having an arc cross section. The conductive elements 601d-602d and 601e-602e may be mounted opposite from one another around the peripheral of the dial 103.

It should be noted that the embodiments illustrated in FIG. 6 are merely examples and are not limited.

Figure 7:
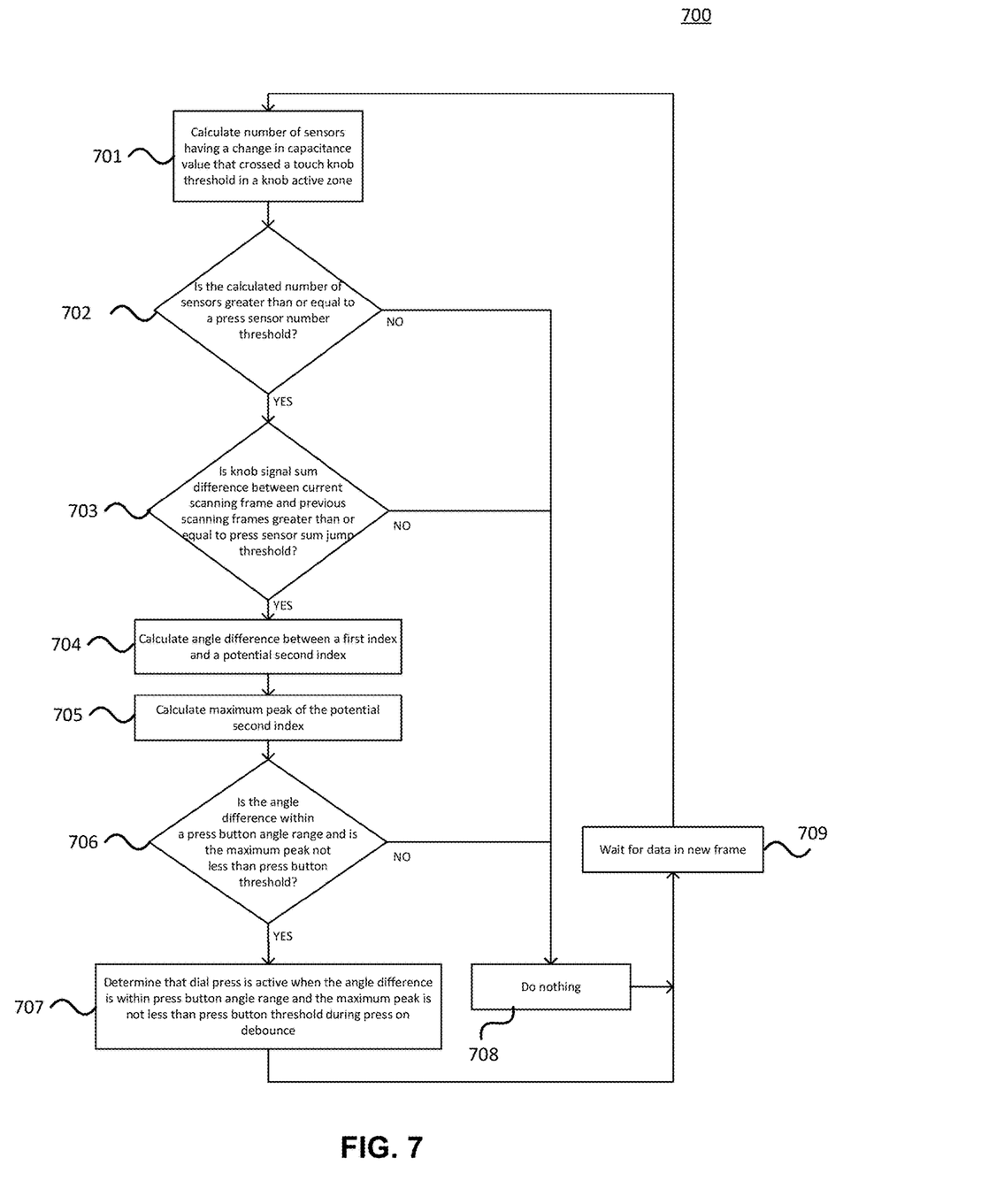
FIG. 7 is a flow diagram illustrating a process of detecting a passive dial state according to an embodiment.

FIG. 7 is a flow diagram illustrating a process of detecting a passive dial state according to an embodiment. Process 700 may be performed by processing logic which may include software, hardware, or a combination thereof.

Referring to FIG. 7, at block 701, a number of sensors, for example capacitive sensors in a knob or dial active zone of a capacitive sense array, having a change in capacitance value that crossed a touch knob (or dial) threshold, for example a threshold value for change in capacitance (e.g., 400), in the knob active zone may be calculated. A knob active zone refers to a zone where sensor reaction to a button index exists. At block 702, it is determined whether the calculated number of sensors is greater than or equal to a press sensor number threshold, for example 4 or 5. If so, the processing logic proceeds to block 703. Otherwise, the processing logic proceeds to block 708 where the processing logic does nothing. As an example of the press sensor number threshold condition, referring back to capacitive sensing matrices 401-402 of FIG. 4, assuming that the touch knob threshold is 400, when the dial is not pressed, the number of sensors that crossed the touch knob threshold is 3 (i.e., 503, 498, 987). When the dial is pressed, the number of sensors that crossed the touch knob threshold is 6 (i.e., 503, 498, 987, 846, 420, 453). Thus, if the press sensor number threshold is set to a value of 4 or 5, the dial or button pressing can be detected.

At block 703, it is determined whether a knob signal sum difference between a current scanning frame and previous scanning frames is greater than or equal to a press sensor sum jump threshold. The knob signal sum difference, for example, may be the difference between a knob signal sum in the current scanning frame (e.g., where the knob or dial button index may be pressed) and a knob signal sum in a previous frame (e.g., where the knob or dial button index is not pressed). The knob signal sum refers to a signal sum of all signals produced by sensors inside a knob area or zone (e.g., knob area corresponding to "Touch Index" or "Button Index" as illustrated in FIG. 4). For example, without a knob press, high signals would only be produced by the sensors in the knob area corresponding to the "Touch Index" (shown in FIG. 4). When the knob is pressed, the "Button Index" may connect to ground or conductive (or metal) parts causing the sensors in the knob area corresponding to the "Button Index" to produce high signals. Accordingly, at a scanning frame, when a knob press is performed, the sum of all sensors signals inside the knob area corresponding to "Button Index" would significantly increase. If the knob signal sum difference is greater than or equal to the press sensor sum jump threshold (e.g., 1000), i.e., a knob press is detected, the processing logic proceeds to block 704. Otherwise, the processing logic proceeds to block 708, which again does nothing. As previously described, a knob signal sum is a signal sum of all sensors inside a knob area. Referring again to capacitive sensing matrices 401-402 of FIG. 4 as an example, without a button press, high signals only appear in the Touch Index area. When Button Index is connected to ground or a metal object, high signals may appear in the Button Index area. Thus, at a scanning frame when a button or dial press is performed, the sum of all sensors signals inside the knob area may significantly increase. In the example shown in FIG. 4, when the button or dial is not pressed, the value of the sum of all sensors signals inside the knob area is about 2600. When the button is pressed, the value of the sum of all sensors signals inside the knob area is about 4600, with a difference in the signal sum being 2000. Therefore, if the press sensor sum jump threshold is set to a value of 1000, a button press can be detected.

At block 704, an angle difference between a first index and a potential second index may be calculated. The first index may represent a touch index and the second index may represent a button press index. As previously described, as a dial (e.g., dial 103 of FIG. 1) is rotated, a first angle of the dial can be detected based on the position of the first index, and a second angle of the dial can be detected based on the position of the second index. The positions of the first and second indices may correspond to positions of conductive elements or parts of the dial (e.g., conductive elements 201-202 of FIG. 2, or conductive part 306 and conductive parts 307-308 of FIGS. 3A-3B) above the capacitive sense array. Thus, the angle difference between the first and second touch indices can be the difference between the first angle of the dial and the second angle of the dial.

At block 705, a maximum peak of the potential second index may be calculated. For example, based on a capacitance touch signal data set received when the conductive element or parts of the dial (e.g., conductive element 202 of FIG. 2, or conductive parts 307-308 of FIGS. 3A-3B) is rotated to the position of the second index, the maximum peak may be a peak value in that data set.

At block 706, it is determined whether the angle difference is within a press button angle range and whether the maximum peak is not less than a press button threshold, for example 500. If both conditions are true, the processing logic proceeds to block 707. Otherwise, the processing logic proceeds to block 708. As an example of the press button threshold condition, referring again to capacitive sensing matrices 401-402 of FIG. 4, when the dial or button is not pressed, a value of the maximum signal in the Button Index area is 20. When the button is pressed, the value of the maximum signal in the Button Index area is 846. Thus, by setting a value of the press button threshold to, for example 500, a strong touch can be confirmed but not signal disparity effect from an ungrounded Button Index.

At block 707, it is determined that the dial press is active or on when the angle difference is within the press button angle range and the maximum peak is not less than (i.e., greater than or equal to) the press button threshold during a press on debounce. Otherwise, when the angle difference is not within the press button angle range or the maximum peak is less than the press button threshold during a press off debounce, it is determined that the dial press is inactive or off, i.e., the dial is not pressed. At block 709, the processing logic waits for data in a new frame, then return to block 701.

Although described with respect to capacitive sensing systems, the embodiments of the present disclosure may be realized in a touch screen panel utilizing any appropriate sensing system (e.g., inductive, resistive).

For example, inductive sensing systems may include one or more sensing elements that pick up loop currents induced by a resonating coil or pair of coils. Some combination of the magnitude, phase, and frequency of the currents may then be used to determine positional information.

In another example, resistive sensing systems may include a flexible and conductive first layer that is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112(f) or 35 U.S.C. 112, sixth paragraph, for that unit/circuit/component.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A touch screen device, comprising:
   a touch screen panel having a capacitive sense array;
   a passive dial including first, second and third conductive parts, the first conductive part and the third conductive part are in proximity to or in contact with a surface of the touch screen panel, and the second conductive part is conductively coupled to the third conductive part when the passive dial is pressed and is not conductively coupled to the third conductive part when the passive dial is not pressed;
   a first conductive spring disposed on top of the first conductive part;
   a second conductive spring disposed between the second conductive part and the third conductive part; and a component of a conductive material, one end of the first conductive spring and the second conductive part being in direct contact with the component, and another end of the first conductive spring being in direct contact with the first conductive part;
wherein
a position of the first conductive part above the capacitive sense array corresponds to a touch index in the capacitive sense array and a position of the third conductive part above the capacitive sense array corresponds to a button press index in the capacitive sense array;
the first, second and third conductive parts are movable in conjunction with a rotation of the passive dial;
wherein
the passive dial further includes a non-conductive part and a rotating element;
the non-conductive part is configured to hold and secure the first, second and third conductive parts, and is assembled on top of and in direct contact with the rotating element for rotation with the rotating element; and
the rotating element is bonded to the touch screen panel.

2. The touch screen device of claim 1, wherein
one end of the second conductive spring is in direct contact with the third conductive part;
another end of the second conductive spring is in direct contact with the second conductive part when the passive dial is pressed to conductively couple the second conductive part to the third conductive part; and
the another end of the second conductive spring is not in contact with the second conductive part when the passive dial is not pressed such that the second conductive part is not conductively coupled to the third conductive part.

3. The touch screen device of claim 1, wherein the rotating element is bonded to the touch screen panel via a polymer layer.

4. The touch screen device of claim 1, wherein the rotating element is disposed approximately at a center of the passive dial.

5. The touch screen device of claim 4, wherein the rotating element is a shaft having bearings mounted thereon.

6. The touch screen device of claim 1, wherein the component is a conductive cover that covers entirely or partially the first, second and third conductive parts, and the first and second conductive springs.

7. The touch screen device of claim 1, wherein
the component is a conductive layer disposed on top of the first conductive spring and the second conductive part;
the passive dial further includes a non-conductive cover that covers entirely or partially the conductive layer, the first, second and third conductive parts, and the first and second conductive springs.

8. The touch screen device of claim 1, wherein a value at the touch index is indicative of a current angle of the passive dial, and a value at the button press index is indicative of whether the passive dial is pressed.

9. A passive dial, comprising:
first, second and third conductive parts, the first conductive part and the third conductive part are in proximity to or in contact with a surface of a touch screen panel having a capacitive sense array, and the second conductive part is conductively coupled to the third conductive part when the passive dial is pressed and is not conductively coupled to the third conductive part when the passive dial is not pressed;
a first conductive spring disposed on top of the first conductive part;
a second conductive spring disposed between the second conductive part and the third conductive part;
a component of a conductive material, one end of the first conductive spring and the second conductive part being in direct contact with the component, and another end of the first conductive spring being in direct contact with the first conductive part;
a rotating element; and
a non-conductive part configured to hold and secure the first, second and third conductive parts, and assembled on top of and in direct contact with the rotating element for rotation with the rotating element;
wherein
a position of the first conductive part above the capacitive sense array corresponds to a touch index in the capacitive sense array and a position of the third conductive part above the capacitive sense array corresponds to a button press index in the capacitive sense array;
the first, second and third conductive parts are movable in conjunction with a rotation of the passive dial;
the rotating element is bonded to the touch screen panel.

10. The passive dial of claim 9, wherein
one end of the second conductive spring is in direct contact with the third conductive part;
another end of the second conductive spring is in direct contact with the second conductive part when the passive dial is pressed to conductively couple the second conductive part to the third conductive part; and
the another end of the second conductive spring is not in contact with the second conductive part when the passive dial is not pressed such that the second conductive part is not conductively coupled to the third conductive part.

11. The passive dial of claim 9, wherein:
the rotating element is bonded to the touch screen panel via a polymer layer, and is disposed approximately at a center of the passive dial.

12. The passive dial of claim 11, wherein the rotating element is a shaft having bearings mounted thereon.

13. The passive dial of claim 9, wherein the component is a conductive cover that covers entirely or partially the first, second and third conductive parts, and the first and second conductive springs.

14. The passive dial of claim 9, wherein
the component is a conductive layer disposed on top of the first conductive spring and the second conductive part;
the passive dial further includes a non-conductive cover that covers entirely or partially the conductive layer, the first, second and third conductive parts, and the first and second conductive springs.

15. The passive dial of claim 9, wherein a value at the touch index is indicative of a current angle of the passive dial, and a value at the button press index is indicative of whether the passive dial is pressed.

* * * * *